United States Patent
Park

(10) Patent No.: US 6,274,425 B1
(45) Date of Patent: Aug. 14, 2001

(54) METHOD FOR MANUFACTURING SEMICONDUCTOR DEVICE

(75) Inventor: Jin Yo Park, Kyoungki-do (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/472,606

(22) Filed: Dec. 27, 1999

(30) Foreign Application Priority Data

Dec. 30, 1998 (KR) .................................................. 98-61976

(51) Int. Cl.[7] .............................................. H01L 21/8242

(52) U.S. Cl. ........................... 438/241; 438/258; 438/620; 438/266

(58) Field of Search ..................................... 438/253, 255, 438/396, 398, 241, 257, 258, 262, 266, 620

(56) References Cited

U.S. PATENT DOCUMENTS

| 5,087,580 | 2/1992 | Eklund . | |
|---|---|---|---|
| 5,545,581 | 8/1996 | Armacost et al. . | |
| 5,956,594 | * 9/1999 | Yang et al. | 438/396 |
| 6,037,215 | * 3/2000 | Lee et al. | 438/253 |
| 6,037,216 | * 3/2000 | Liu et al. | 438/253 |

* cited by examiner

Primary Examiner—Tuan H. Nguyen
(74) Attorney, Agent, or Firm—Jacobson Holman, PLLC

(57) ABSTRACT

Disclosed is a method for manufacturing a semiconductor device. The method comprises the steps of forming a bit line contact plug and a storage electrode contact plug which are connected to a semiconductor substrate; etching a capping nitride film above a word line which is positioned at a peripheral circuit part of the semiconductor substrate; forming a bit line which is connected to the bit line contact plug and the word line; etching a capping nitride film above the bit line of the peripheral circuit part; and forming a metal wiring contact hole which reveals the semiconductor substrate, the word line and the bit line.

16 Claims, 3 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more particularly, the present invention relates to a method for manufacturing a semiconductor device, in which, in order to prevent a semiconductor substrate from being damaged when implementing a metal wiring contact process for forming a metal wiring of a peripheral circuit part, a capping nitride film positioned above a word line of the peripheral circuit part is first etched and then subsequent processes are performed, thereby minimizing the extent to which the semiconductor substrate is damaged during the metal wiring contact process.

2. Description of the Related Art

A recent trend for the high integration of a semiconductor device is largely influenced by a development of a micropattern forming technique. In order to accomplish the high integration of a semiconductor device, it is regarded as being indispensable to make a photoresist film pattern which is widely used as a mask in an etching process or an ion-implanting process so that the photoresist film pattern has a micro dimension.

A resolution R of a photoresist film pattern is proportional to a wavelength of light emitted from a light source of a stepper and a process parameter k and is inversely proportional to a lens diameter NA (numerical aperture). The resolution R can be expressed by the following equation:

$$R = k * \lambda / NA,$$

where R=resolution, $\lambda$=wavelength of light source, NA=numerical aperture

Here, in order to improve the resolution of the stepper, the wavelength is generally reduced. For example, steppers using light sources such as a G-line and an I-line respectively having wavelengths of 436 nm and 365 nm have limitations of that they have light resolutions capable of forming patterns with dimensions of about 0.7 $\mu$m and 0.5 $\mu$m, respectively. In order to form a micro pattern which is no greater than 0.5 $\mu$m, an exposure system which employs as its light source a deep ultra violet (DUV) having a small wavelength, that is, a KrF laser having a wavelength of 248 nm or an ArF laser having a wavelength of 193 nm, is used.

Also, as means for improving a resolution by virtue of modifying processes, a method for using a phase shift mask instead of a photo mask, a contrast enhancement layer (CEL) method in which a separate thin film capable of enhancing an image contrast is formed on a wafer, a tri layer resist (TLR) method in which an intermediate layer such as a spin-on-glass (SOG) film is intervened between two photoresist films, a sililation method in which silicon is selectively injected onto a photoresist film, etc. may be used.

In addition, as a semiconductor device is gradually highly integrated, a contact hole for connecting upper and lower conductor wiring is decreased in its size, a spacing between the contact hole and an adjacent wiring is decreased, and an aspect ratio which is a ratio between a diameter and a depth of the contact hole is increased. Accordingly, in a highly integrated semiconductor device having multi-layered conductor wirings, in order to form a contact, it is required that masks be precisely and strictly aligned one with another during manufacturing processes of the semiconductor device, whereby a process margin is diminished.

In order to maintain a proper spacing between contact holes, masks are formed considering a misalignment tolerance when aligning the masks, a lens distortion when implementing an exposing process, a critical dimension variation when preparing masks and implementing photolithographic processes, a registration between masks, and so on.

Further, in order to overcome limitations in performing a lithographic process for forming a contact hole, a self-aligning contact (SAC) technology which forms a contact hole by a self-aligning method is disclosed in the art.

While the SAC method may use a polysilicon, a nitride film or an oxidized nitride film in a preferred fashion, the SAC method uses a nitride film.

While not shown in the drawings, a method for manufacturing a semiconductor device using the self-aligning contact technology, according to the conventional art, will be described hereinafter.

First, a predefined lower structure, for example, a MOS field effect transistor (MOSFET) having a device isolating insulation film and a gate insulation film, a gate electrode which is overlapped with a mask oxide film pattern, source/drain regions, etc. is formed on a semiconductor substrate. Then, an etch barrier and an interlayer insulation film made of an oxide are sequentially formed on an entire surface of the resultant structure.

Then, after forming a photoresist film pattern for revealing the interlayer insulation film positioned on a portion which is predefined as a contact such as for a storage electrode and a bit line in the semiconductor substrate, the etch barrier is revealed by dry etching the interlayer insulation film which is revealed by the photoresist film pattern, and a contact hole is formed by etching the etch barrier again.

In the above description, if a polysilicon is used as the etch barrier, the etch barrier can be forwardly formed or a polysilicon layer pad can be formed only at a region where the contact hole is to be formed. In the polysilicon SAC method, since the polysilicon having an etching mechanism other than as in an oxide film, is used as the etch barrier, a high etch selection ratio can be obtained, but in a vapor deposition method over an entire surface, insulation reliability between contact holes is deteriorated. Also, in a method of forming a pad, in case that a misalignment is generated between a contact pad and a silicon substrate, the silicon substrate can be damaged. Moreover, in order to prevent the silicon substrate from being damaged, a method for enlarging a contact pad using a spacer or a polymer is disclosed in the art. However, with this method, a design rule of no greater than 0.18 $\mu$m cannot be realized.

To cope with this problem, another SAC method in which a nitride film is used as an etch barrier is disclosed in the art.

As a result, in the method for manufacturing a semiconductor device according to the conventional art, constructed as mentioned above, as a semiconductor device is gradually highly integrated, because a topology is increased between the cell part and the peripheral circuit part, the nitride film above the gate electrode which is formed on the peripheral circuit part having a low topology may not be etched when implementing the etching process for forming the metal wiring contact, and according to this, the metal wiring contact may not be fully opened. In addition, a junction region of the semiconductor substrate may be damaged while the nitride film is completely etched, and according to this, a leakage current can be induced thereby degrading a process yield and reliability in a device operation.

SUMMARY OF THE INVENTION

Accordingly, the present invention has been made in an effort to solve the problems occurring in the related art, and an objective of the present invention is to provide a method for manufacturing a semiconductor device, in which, in order to minimize the extent to which a semiconductor substrate is damaged and reduce contact resistance when implementing a metal wiring contact process for a peripheral circuit part, a capping nitride film positioned above a word line of the peripheral circuit part is first etched and then subsequent processes are performed to form a metal wiring, thereby improving properties and reliability of the semiconductor device.

In order to achieve the above objective, according to one aspect of the present invention, a method for manufacturing a semiconductor device comprises a step of: etching a capping nitride film which is positioned above a word line and a bit line of a peripheral circuit part, thereby reducing contact resistance and decreasing the extent to which a semiconductor substrate is damaged when implementing a subsequent metal wiring contact process.

According to another aspect of the present invention, a method for manufacturing a semiconductor device, the method comprises the steps of: forming a bit line contact plug and a storage electrode contact plug which are connected to a semiconductor substrate; etching a capping nitride film above a word line which is positioned at a peripheral circuit part of the semiconductor substrate; forming a bit line which is connected to the bit line contact plug and the word line; etching a capping nitride film above the bit line of the peripheral circuit part; and forming a metal wiring contact hole which reveals the semiconductor substrate, the word line and the bit line.

According to another aspect of the present invention, a method for manufacturing a semiconductor device comprises the steps of: forming a word line which is formed by a stack structure of a polycide, a capping polysilicon and a capping nitride film, on a semiconductor substrate; forming a first insulation film spacer on a side wall of the word line; forming a nitride film on a surface of the semiconductor substrate; forming a second insulation film spacer on a side wall of the first insulation film spacer and forming a first interlayer insulation film for flattening an upper portion of the second insulation film spacer; forming a storage electrode contact plug and a bit line contact plug which are connected to impurity regions of a cell part and a peripheral circuit part of the semiconductor substrate; etching the capping nitride film above the word line in the peripheral circuit part and forming a second interlayer insulation film on an entire upper surface of the resultant structure; forming a bit line which is connected to the bit line contact plug of the cell part and the peripheral circuit part and to the word line of the peripheral circuit part; etching the capping nitride film above the bit line and forming a third interlayer insulation film for flattening an entire upper portion of the resultant structure; and etching a metal wiring contact for etching the third interlayer insulation film, the second interlayer insulation film and the first interlayer insulation film, thereby to reveal the bit line, word line and the semiconductor substrate.

BRIEF DESCRIPTION OF THE DRAWINGS

The above objectives, and other features and advantages of the present invention will become more apparent after reading the following detailed description when taken in conjunction with the drawings, in which.

DETAILED DESCRIPTION OF PREFERRED EMBODIMENTS

Figure 1:
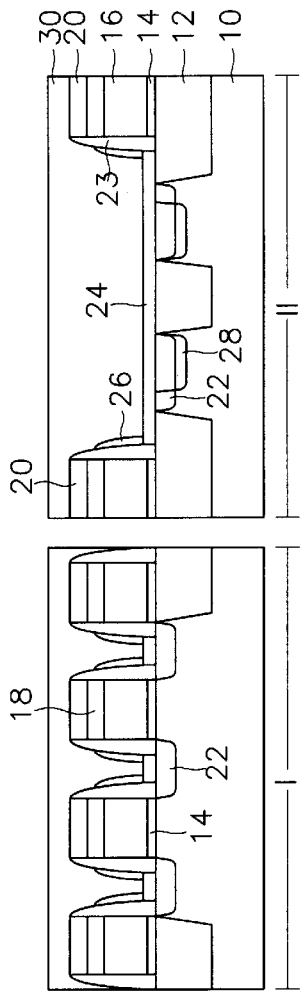
FIGS. 1 through 8 are cross-sectional views illustrating a method for manufacturing a semiconductor device in accordance with an embodiment of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

FIGS. 1 through 8 are cross-sectional views illustrating a method for manufacturing a semiconductor device in accordance with an embodiment of the present invention.

First, desired kinds of impurities are ion-implanted into desired portions of a semiconductor substrate 10 which has a cell part I and a peripheral circuit part II such that the impurities exist in desired patterns at channel portions of a well and a transistor and below a device isolating region. Then, a device isolating insulation film 12 is formed on a portion which is predefined as the device isolating region in the semiconductor substrate 10, and a gate insulation film 14 is formed on an entire surface of the resultant structure.

Next, a stack structure of a tungsten polycide film, a capping polysilicon layer and a capping nitride film is formed; and by etching the stack structure using as an etching mask a gate electrode mask serving to protect a portion which is predefined as a gate electrode, the gate electrode 16 which is formed by the tungsten polycide film, a capping polysilicon layer pattern 18 which is stacked onto the gate electrode 16 and a capping nitride film pattern 20 are formed. The gate electrode 16 which is formed by the tungsten polycide film is made of transition metal, for example a silicide film such as Ti, Mo, Nb, Ta, and Cr, thereby to reduce resistance. In another example, the gate electrode 16 may be made of heat-resistant metal such as W or the like, or may be formed of a single layer of a polysilicon without using metal.

Then, by ion-implanting lightly-doped impurities into the semiconductor substrate 10 at both sides of the etched portion of the stack structure, a lightly-doped impurity region 22 is formed.

Then, after forming a first insulation film on an entire surface of the resultant structure, by etching the entire surface, a first insulation film spacer 23 is formed on a side wall of the stack structure. The first insulation film is formed by a nitride film.

Thereafter, a pad nitride film 24 having thickness of 50~200 Å is formed on the entire surface of the resultant structure.

Then, after forming a second insulation film on the pad nitride film 24 by etching the entire surface, a second insulation film spacer 26 is formed on a side wall of the first insulation film spacer 23. The second insulation film is formed by an oxide film.

Then, by ion-implanting highly-doped impurities into the semiconductor substrate 10 at both sides of the second insulation film spacer 26 on the peripheral circuit part II, a highly-doped impurity region 28 is formed.

Thereafter, a first interlayer insulation film 30 is formed on the entire surface of the resultant structure to flatten the entire surface.

At this time, the first interlayer insulation layer 30 is formed by an oxide layer having excellent flowability (see FIG. 1).

Figure 2:
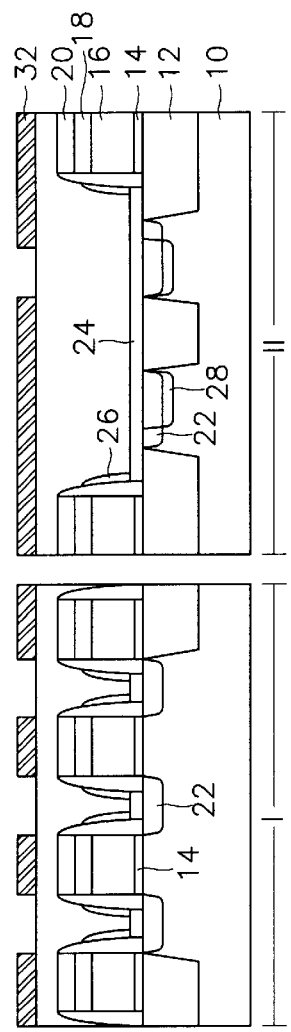

Next, a first photoresist film pattern 32 which reveals portions predefined as bit line contacts and a storage electrode contact at the cell part I and a portion predefined as a bit line contact at the peripheral contact part II, is formed on the first interlayer insulation film 30 (see FIG. 2).

Then, first bit line contact holes 34b, 34c and a storage electrode contact hole 34a are formed by etching the first interlayer insulation film 30, the second insulation film spacer 26 and the pad nitride film 24 using the first photoresist film pattern 32 as an etching mask.

Figure 3:
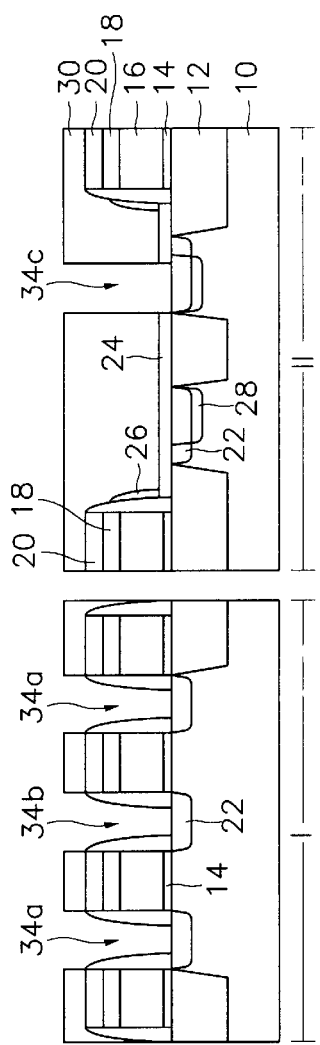

Thereafter, the first photoresist pattern 32 is removed (see FIG. 3).

After that, a first conductive layer which covers the first bit line contact holes 34b and 34c and the storage electrode contact hole 34a is formed.

Figure 4:
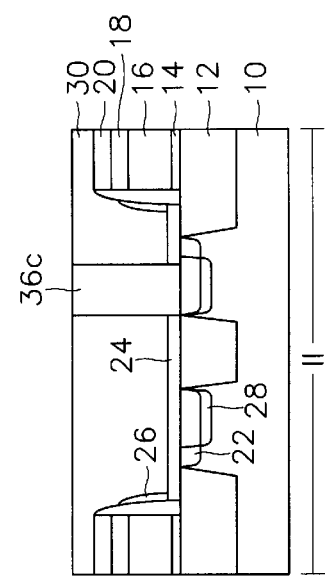
Figure 4:
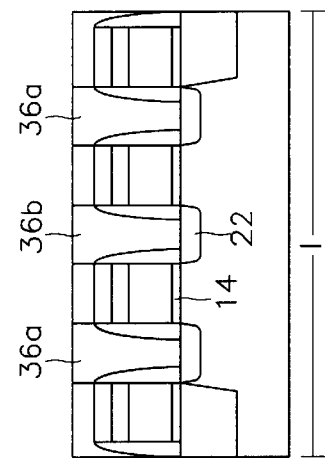

Then, bit line contact plugs 36b and 36c and a storage electrode contact plug 36a are formed by removing the first conductive layer using an entire surface etching process or a chemical mechanical polishing (CMP) process (see FIG. 4).

Figure 5:
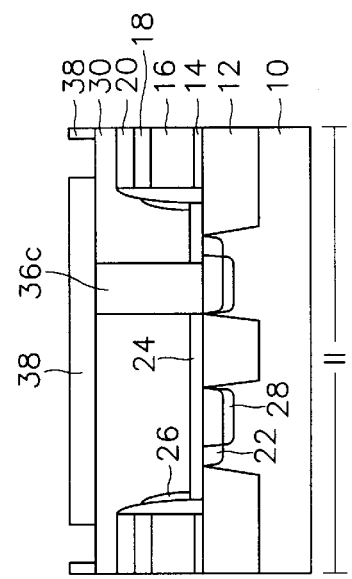
Figure 5:
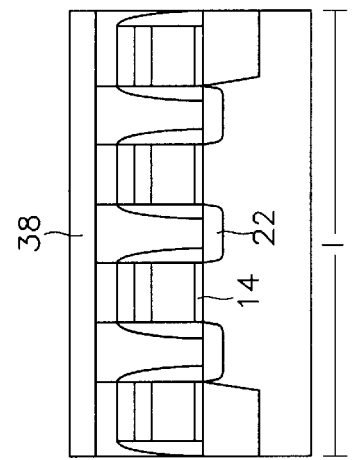

Next, a second photoresist film pattern 38 which reveals portions predefined as a metal wiring contact and a bit line contact at the gate electrode 16 on the peripheral circuit part II is formed on an entire surface of the resultant structure (see FIG. 5).

Thereafter, a metal wiring contact hole 40a and a second bit line contact hole 40b are formed by etching the first interlayer insulation film 30 and the capping nitride film 20 which are formed above the gate electrode 16 at the peripheral circuit part II, using the second photoresist film pattern 38 as an etching mask.

Figure 6:
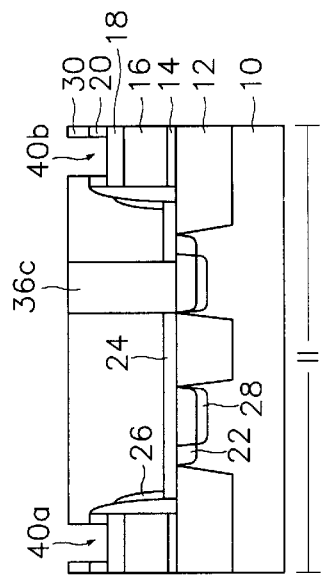
Figure 6:
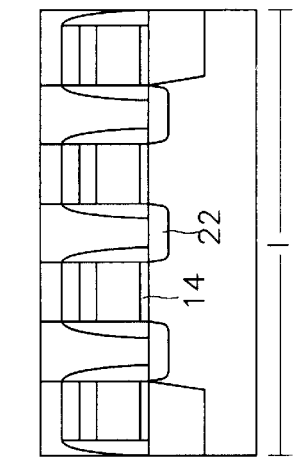
Figure 7:
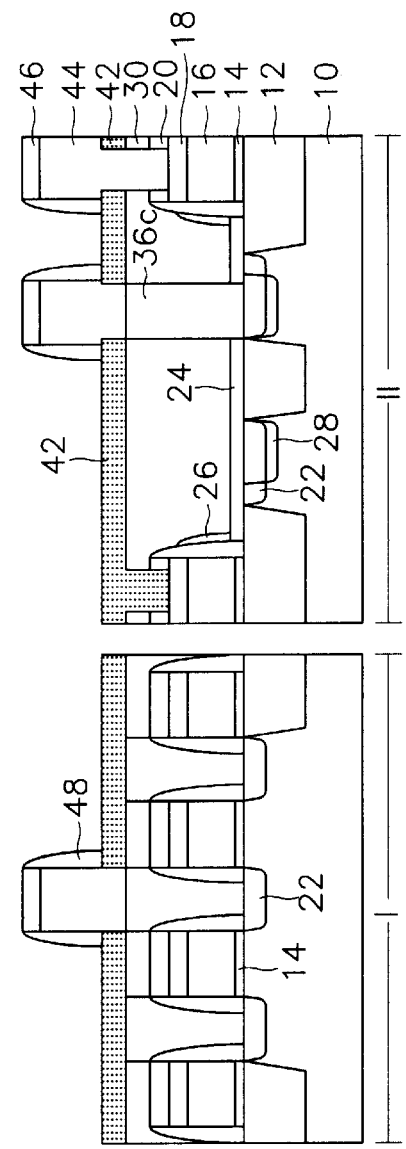

After that, the second photoresist film pattern 38 is removed (see FIG. 6).

Next, a second interlayer insulation film 42 which reveals the first bit line contact plugs 36b and 36c at the cell part I and the peripheral circuit part II and a portion predefined as a bit line contact above the gate electrode 16 at the peripheral circuit part II is formed on an entire surface of the resultant structure. At this time, the second interlayer insulation film 42 is formed by an oxide film having excellent flowability.

Then, a bit line 44 which is connected with the first bit line contact plugs 36b and 36c and the gate electrode 16 is formed. A second capping nitride film 46 is stacked onto the bit line 44, and a third insulation film spacer 48 is formed on a side wall of the bit line 44 (see FIG. 7).

Thereafter, a third interlayer insulation film 50 is formed on an entire surface of the resultant structure to flatten the entire surface; and metal wiring contact holes 52a, 52b and 52c are formed by etching the third interlayer insulation film 50, the second interlayer insulation film 42 and the first interlayer insulation film 30 at portions which are predefined as the gate electrode 16 and the bit line 44 on the peripheral circuit part II and the metal wiring on the semiconductor substrate 10.

Figure 8:
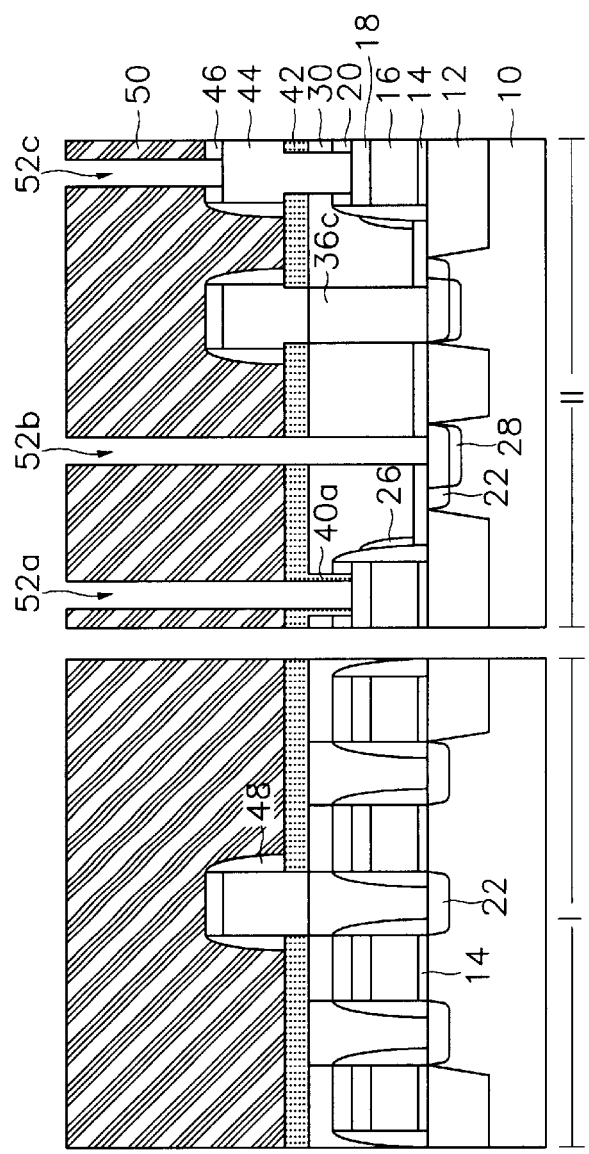

At this time, the third interlayer insulation film 50 is formed by an oxide layer having excellent flowability (see FIG. 8).

As described above, by the method for manufacturing a semiconductor device according to the present invention, advantages are provided in that, in a process of forming on a peripheral circuit part of a semiconductor substrate a gate electrode on which a nitride film is stacked or a bit line and forming on an active region of the semiconductor substrate a metal wiring contact, since the nitride film which is stacked on the gate electrode is first removed, and then an interlayer insulation film which belongs to a series of oxide films is removed to form a metal wiring contact hole. Also, when subsequently implementing an etching process for forming the metal wiring contact hole, an etch-stop phenomenon is not generated in the peripheral circuit part having a low topology and the active region of the semiconductor substrate is prevented from being damaged due to an excessive etching, whereby a junction leakage current is minimized and according to this, properties and reliability of the semiconductor device are improved.

In the drawings and specification, there have been disclosed typical preferred embodiments of the invention and although specific terms are employed, they are used in a generic and descriptive sense only and not for purposes of limitation, the scope of the invention being set forth in the following claims.

What is claimed is:

1. A method for manufacturing a semiconductor device, the method comprising the steps of:

forming a word line in a peripheral circuit part of a semiconductor substrate;

forming a bit line on the word line;

forming a capping nitride film on the bit line;

selectively etching the capping nitride film above the word line, the selectively etched capping nitride film, the word line and the bit line forming a lower structure;

forming an intermediate insulating film over an exposed surface of the lower structure; and forming a metal wiring contact hole by selectively removing the intermediate insulating film.

2. The method as set forth in claim 1, wherein the metal wiring contact hole includes a word line contact hole, a bit line contact hole and a substrate contact hole.

3. The method as set forth in claim 1, wherein the word line is formed by a stack structure of a polycide, a capping polysilicon and a capping nitride film.

4. A method for manufacturing a semiconductor device, the method comprising the steps of:

forming a word line at a peripheral circuit part of a semiconductor substrate;

forming a first capping nitride film on the word line;

forming a pad nitride film having a thickness of approximately 50 to 200 Å on the semiconductor substrate;

forming a bit line contact plug and a storage electrode contact plug which are connected to the semiconductor substrate;

etching the first capping nitride film above the word line;

forming a bit line on the word line, the bit line being connected to the bit line contact plug and the word line;

forming a second capping nitride film on the bit line;

forming an intermediate insulating film over an exposed surface of a resulting structure;

selectively etching the intermediate insulating film, the second capping nitride film above the bit line of the peripheral circuit part and the pad nitride film to form a metal wiring contact hole which reveals the semiconductor substrate, the word line and the bit line.

5. A method as claimed in claim 4, wherein the word line is formed by a stack structure of a polysilicon, a tungsten silicide, a capping polysilicon and a capping nitride film.

6. A method for manufacturing a semiconductor device, the method comprising the steps of:

forming a word line which is formed by a stack structure of a polycide, a capping polysilicon and a capping nitride film on a semiconductor substrate;

forming a first insulation film spacer on a side wall of the word line;

forming a pad nitride film on a surface of the semiconductor substrate;

forming a second insulation film spacer on a side wall of the first insulation film spacer and forming a first interlayer insulation film thereon for flattening an upper portion of the second insulation film spacer;

forming a storage electrode contact plug and a bit line contact plug which are connected to impurity regions of a cell part and a peripheral circuit part of the semiconductor substrate, respectively;

etching the capping nitride film above the word line in the peripheral circuit part and forming a second interlayer insulation film on an entire upper surface of a resultant structure;

forming a bit line which is connected to the bit line contact plug of the cell part and the peripheral circuit part and to the word line of the peripheral circuit part;

forming a second capping nitride film;

etching the second capping nitride film above the bit line and forming a third interlayer insulation film for flattening an entire upper portion of a resultant structure; and forming a metal wiring contact hole by etching the third interlayer insulation film, the second interlayer insulation film, the first interlayer insulation film and the pad nitride film, thereby to reveal the bit line, word line and the semiconductor substrate.

7. A method as claimed in claim 6, wherein the first insulation film spacer is formed by a nitride film.

8. A method as claimed in claim 6, wherein the second insulation film spacer is formed by an oxide film.

9. A method as claimed in claim 6, wherein the first through third interlayer insulation films are formed by oxide films, respectively.

10. The method as set forth in claim 6, wherein the step of forming a first insulation film spacer comprises the steps of forming a first insulation film on an entire surface of a resulting structure and etching the entire surface to form the first insulation film spacer.

11. The method as set forth in claim 10, wherein the step of forming a second insulation film spacer comprises the steps of forming a second insulation film on the pad nitride film and etching a resulting surface to form the second insulation film spacer.

12. A method for manufacturing a semiconductor device having a cell part and a peripheral circuit part, the method comprising the steps of:

forming, in the peripheral circuit part, a stack structure of a polycide, a capping polysilicon and a capping nitride film on a semiconductor substrate to form a word line;

forming a first insulation film spacer on a side wall of the word line;

forming a pad nitride film on a surface of the peripheral circuit part of the semiconductor substrate;

forming a second insulation film spacer on a side wall of the first insulation film spacer;

forming a first interlayer insulation film on the pad nitride film and the first and second insulation film spacers for flattening an upper portion of the second insulation film spacer;

forming a storage electrode contact plug and a bit line contact plug which are connected to impurity regions of the cell part of the semiconductor, and forming a second bit line contact plug which is connected to impurity regions of the peripheral circuit part of the substrate;

etching the first interlayer insulation film and the capping nitride film above the word line in the peripheral circuit part;

forming a second interlayer insulation film on an entire upper surface of a resultant structure;

forming a bit line which is connected to the bit line contact plug of the cell part, the second bit line contact plug of the peripheral circuit part, and to the word line of the peripheral circuit part;

stacking and etching a second capping nitride film above the bit line;

forming a third interlayer insulation film for flattening an entire upper portion of a resultant structure; and forming a metal wiring contact hole by etching the third interlayer insulation film, the second interlayer insulation film, the first interlayer insulation film and the pad nitride film, thereby to reveal the bit line, word line and the semiconductor substrate.

13. The method as set forth in claim 12, wherein the step of forming a first insulation film spacer comprises the steps of forming a first insulation film on an entire surface of a resulting structure and etching the entire surface to form the first insulation film spacer.

14. The method as set forth in claim 12, wherein the step of forming a second insulation film spacer comprises the steps of forming a second insulation film on the pad nitride film and etching a resulting surface to form the second insulation film spacer.

15. The method as set forth in claim 12, further comprising, after the step of forming a first interlayer insulation film, the steps of:

forming a first photoresist film pattern on the first interlayer insulation film;

etching, using the first photoresist film pattern as an etching mask, the first interlayer insulation film, the second insulation film spacer, and the pad nitride film to form a bit line contact hole and a storage electrode contact hole; and removing the first photoresist pattern.

16. The method as set forth in claim 15, further comprising, after the step of forming a storage electrode contact plug and a bit line contact plug, the steps of:

forming a second photoresist pattern on a resulting structure; and using the second photoresist pattern as an etching mask for the step of etching the first interlayer insulation film and the capping nitride film.

* * * * *